US009236272B2

(12) United States Patent
Moriya (10) Patent No.: US 9,236,272 B2
(45) Date of Patent: Jan. 12, 2016

(54) ETCHING APPARATUS AND ETCHING METHOD

(71) Applicant: Tokyo Electron Limited, Minato-ku (JP)

(72) Inventor: Shuji Moriya, Yamanashi (JP)

(73) Assignee: TOKYO ELECTRON LIMITED, Minato-ku (JP)

( * ) Notice: Subject to any disclaimer, the term of this patent is extended or adjusted under 35 U.S.C. 154(b) by 0 days.

(21) Appl. No.: 14/022,449

(22) Filed: Sep. 10, 2013

(65) Prior Publication Data

US 2014/0076849 A1    Mar. 20, 2014

(30) Foreign Application Priority Data

Sep. 14, 2012   (JP) .................... 2012-203418

(51) Int. Cl.
| | |
|---|---|
| H01L 21/302 | (2006.01) |
| H01L 21/465 | (2006.01) |
| H01L 21/67 | (2006.01) |
| H01L 21/3065 | (2006.01) |
| H01L 21/311 | (2006.01) |

(52) U.S. Cl.
CPC .......... *H01L 21/465* (2013.01); *H01L 21/3065* (2013.01); *H01L 21/31116* (2013.01); *H01L 21/67069* (2013.01)

(58) Field of Classification Search
CPC ............. H01L 21/3065; H01L 21/465; H01L 21/67069; H01L 21/02046; H01L 21/02057; H01L 21/31116; H01L 21/3113

USPC ......... 438/706, 710, 712, 714, 720, 723, 725, 438/736, 762; 216/58, 63, 64
See application file for complete search history.

(56) References Cited

U.S. PATENT DOCUMENTS

| | | | |
|---|---|---|---|
| 5,505,816 A * | 4/1996 | Barnes et al. ................. 438/695 |
| 8,187,486 B1 * | 5/2012 | Liu et al. ......................... 216/79 |
| 8,252,194 B2 * | 8/2012 | Kiehlbauch et al. ............ 216/62 |
| 2004/0262254 A1 | 12/2004 | Ozawa et al. |
| 2005/0241669 A1 * | 11/2005 | Wodecki ........................ 134/1.1 |
| 2009/0004363 A1 * | 1/2009 | Keshner et al. .................... 427/8 |
| 2009/0170321 A1 * | 7/2009 | Cho et al. ...................... 438/692 |
| 2009/0191340 A1 * | 7/2009 | Tozawa .................... 427/255.39 |
| 2011/0035957 A1 | 2/2011 | Muraki et al. |
| 2012/0247670 A1 * | 10/2012 | Dobashi et al. .......... 156/345.31 |

FOREIGN PATENT DOCUMENTS

| | | |
|---|---|---|
| JP | 2005-39185 | 2/2005 |
| JP | 2008-160000 | 7/2008 |

* cited by examiner

*Primary Examiner* — Lan Vinh
(74) *Attorney, Agent, or Firm* — Oblon, McClelland, Maier & Neustadt, L.L.P.

(57) ABSTRACT

An etching apparatus includes: a chamber configured to accommodate a substrate to be processed having an etching target film; a gas exhaust mechanism configured to exhaust an inside of the chamber; an etching gas supply mechanism configured to supply an etching gas into the chamber; and a gas cluster generation mechanism configured to generate a gas cluster in the chamber by spraying a cluster gas into the chamber, wherein a gas produced by a reaction when the etching target film is etched with the etching gas is discharged from the chamber by the gas cluster generated by the gas cluster generation mechanism.

11 Claims, 5 Drawing Sheets

ETCHING APPARATUS AND ETCHING METHOD

CROSS-REFERENCE TO RELATED APPLICATION

The present invention claims priority of Japanese Patent Application No. 2012-203418 filed on Sep. 14, 2012, the entire contents of which are incorporated herein by reference.

FIELD OF THE INVENTION

The present invention relates to an etching apparatus and an etching method for etching a film made of a specific material formed on a substrate.

BACKGROUND OF THE INVENTION

Recently, in manufacturing of a semiconductor device, a non-plasma based dry etching referred to as a chemical oxide removal (COR) process is attracting attention as a method of performing a miniature etching which substitutes for a dry etching or a wet etching (see, e.g., Japanese Patent Application Publication Nos. 2005-39185 and 2008-160000).

In the COR process, HF gas, a gas mixture of HF and $NH_3$, or the like is used in a case of etching a film made of a silicon-based material such as Si, $SiO_2$, SiN or the like. In this case, the film is required to be etched with a good selectivity.

It is known that, among those materials, a film made of SiN can be etched with HF gas and a film made of $SiO_2$ is difficult to be etched with HF gas but can be etched with the gas mixture of HF and $NH_3$. Accordingly, in a case where the SiN film coexists with the $SiO_2$ film, if the SiN film needs to be etched with a higher selectivity than the $SiO_2$ film, HF gas is expected to be available.

However, when the SiN film is etched with HF gas, $NH_3$ is produced as a reaction product and thus the $SiO_2$ film is etched by the HF gas and the $NH_3$ gas. Therefore, in practice, it is difficult to etch the SiN film with a higher selectivity than the $SiO_2$ film by using HF gas. This problem is not limited to the case where the SiN film coexists with the $SiO_2$ film and the SiN film is etched with HF gas. When a layer of a laminated film is etched with an etching gas, the above problem occurs if a different gas, contributing to an etching of a different layer of the laminated film, is produced.

In order to solve the above problem, a gas produced by a reaction may be purged by vacuum-exhausting the inside of a chamber and supplying a purge gas at an appropriate timing. However, purging the inside of the chamber takes time and mass productivity becomes poor.

SUMMARY OF THE INVENTION

In view of the above, the present invention provides an etching apparatus and an etching method which can remove from a chamber in a short time a gas produced by a reaction when an etching target film is etched with an etching gas.

In accordance with a first aspect of the present invention, there is provided an etching apparatus, including: a chamber configured to accommodate a substrate to be processed having an etching target film; a gas exhaust mechanism configured to exhaust an inside of the chamber; an etching gas supply mechanism configured to supply an etching gas into the chamber; and a gas cluster generation mechanism configured to generate a gas cluster in the chamber by spraying a cluster gas into the chamber, wherein a gas produced by a reaction when the etching target film is etched with the etching gas is discharged from the chamber by the gas cluster generated by the gas cluster generation mechanism.

Further, in the etching apparatus, the etching gas supply mechanism and the gas cluster generation mechanism may include a common shower head through which the etching gas is injected into the chamber and the cluster gas is sprayed into the chamber.

Further, in the etching apparatus, the etching target film may be a SiN film, the etching gas may be HF gas, and the gas produced by the reaction may be $NH_3$ gas.

Further, in the etching apparatus, the substrate may have a laminated film on its surface, a layer of the laminated film may be the etching target film, and the gas produced by the reaction may contribute to an etching of a different layer of the laminated film. In this case, the etching target film may be a SiN film, the different layer of the laminated film may be a $SiO_2$ film, the etching gas may be HF gas, and the gas produced by the reaction may be $NH_3$ gas.

Further, in the etching apparatus, the gas cluster generation mechanism may use an inert gas as the cluster gas.

In accordance with a second aspect of the present invention, there is provided an etching method, including: accommodating a substrate to be processed having an etching target film into a chamber; supplying an etching gas into the chamber to etch the etching target film; and discharging, from the chamber, a gas produced by a reaction when the etching target film is etched, by using a gas cluster generated by a cluster gas sprayed into the chamber.

Further, in the etching method, the etching target film may be a SiN film, the etching gas may be HF gas, and the gas produced by the reaction may be $NH_3$ gas.

Further, in the etching method, the substrate may have a laminated film on its surface, a layer of the laminated film may be the etching target film and the gas produced by the reaction may contribute to an etching of a different layer of the laminated film. In this case, the etching target film may be a SiN film, the different layer of the laminated film may be a $SiO_2$ film, the etching gas may be HF gas, and the gas produced by the reaction may be $NH_3$ gas.

Further, in the etching method, an inert gas may be used as the cluster gas. In this case, the cluster gas may be Ar gas or $CO_2$ gas.

Further, in the etching method, said etching the etching target film and said discharging the gas produced by the reaction may be alternately performed. Further, said etching the etching target film and said discharging the gas produced by the reaction may be simultaneously performed.

In accordance with a third aspect of the present invention, there is provided a storage medium storing a program for controlling an etching apparatus, wherein, when executed on a computer, the program controls the etching apparatus such that the etching method is performed.

EFFECT OF THE INVENTION

In accordance with the present invention, the gas produced by the reaction during the etching process of the etching target film with the etching gas is discharged from the chamber by a gas cluster generated by a gas cluster generation mechanism. Accordingly, the gas produced by the reaction can be removed from the chamber in a very short time.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

Hereinafter, embodiments of the present invention will be described with reference to the accompanying drawings which form a part hereof.

Figure 1:
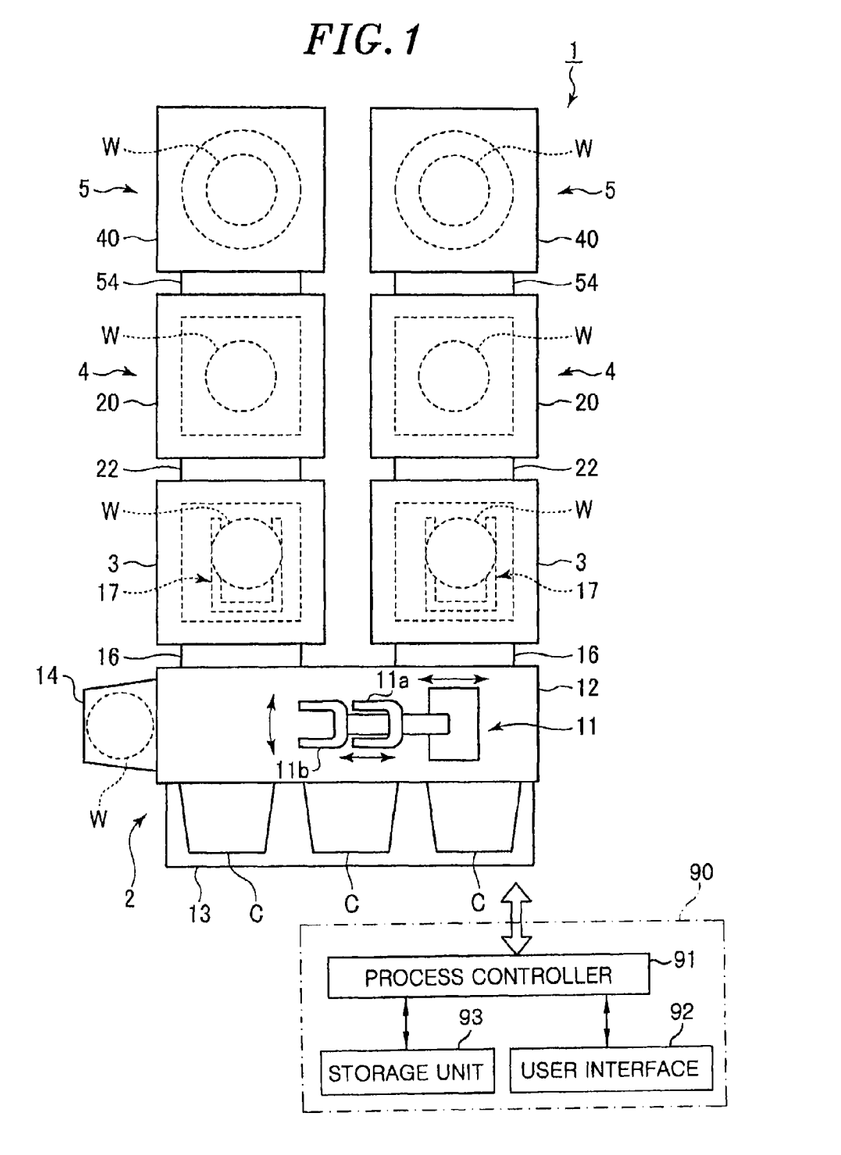
FIG. 1 shows a schematic configuration of a processing system including an etching apparatus in accordance with an embodiment of the present invention.

FIG. 1 shows a schematic configuration of a processing system including an etching apparatus in accordance with an embodiment of the present invention. The processing system 1 includes: a loading/unloading unit 2 for loading/unloading a semiconductor wafer (hereinafter, referred to simply as "wafer") W; two load-lock chambers 3 provided adjacent to the loading/unloading unit 2; post heat treatment (PHT) apparatuses 4, for performing post heat treatment on the wafer W, respectively provided adjacent to the load-lock chambers 3 and; chemical oxide removal (COR) processing apparatuses 5, for performing chemical oxide removal processing, which is a non-plasma etching, on the wafer W, respectively provided adjacent to the PHT apparatuses 4.

The COR processing apparatuses 5 serves as an etching apparatus in accordance with the present embodiment and etches SiN film formed on a surface of the wafer W with HF gas. The load-lock chambers 3, the PHT apparatuses 4 and the COR processing apparatuses 5 are arranged linearly in that order.

The loading/unloading unit 2 includes a transfer chamber 12 in which a first transfer mechanism 11 for transferring the wafer W is arranged. The first transfer mechanism 11 has two transfer arms 11a and 11b, which hold the wafer W in a substantially horizontal direction. At one longitudinal side of the transfer chamber 12, a mounting base 13 is provided. A plurality of, e.g., three carriers C, each capable of accommodating multiple wafers W, can be connected to the mounting base 13. Further, an orienter 14, which performs position alignment by optically obtaining eccentricity by rotating the wafer W, is installed adjacent to the transfer chamber 12.

In the loading/unloading unit 2, the wafer W is held by the transfer arms 11a and 11b and the first transfer mechanism 11 can transfer the wafer W to a desired position by moving the wafer W straight in a horizontal plane and elevating the wafer W up and down. The wafer W is transferred between the carriers C on the mounting base 13, the orienter 14 and the load-lock chambers 3 by the extension and retraction of the transfer arms 11a and 11b.

Each of the load-lock chambers 3 is connected to the transfer chamber 12 through a gate valve 16 arranged therebetween. In each of the load-lock chambers 3, there is provided a second transfer mechanism 17 for transferring the wafer W.

Further, the load-lock chamber 3 is configured to be evacuated to a predetermined vacuum level.

The second transfer mechanism 17 has an articulated arm and a pick for substantially horizontally maintaining the wafer W. In the second transfer mechanism 17, the pick is positioned in the load-lock chamber 3 with the articulated arm retracted, and when the articulated arm is extended, the pick reaches the PHT apparatus 4. When the articulated arm is further extended, the pick can reach the COR processing apparatus 5. Therefore, it is possible to transfer the wafer W among the load-lock chamber 3, PHT apparatus 4 and the COR processing apparatus 5.

Figure 2:
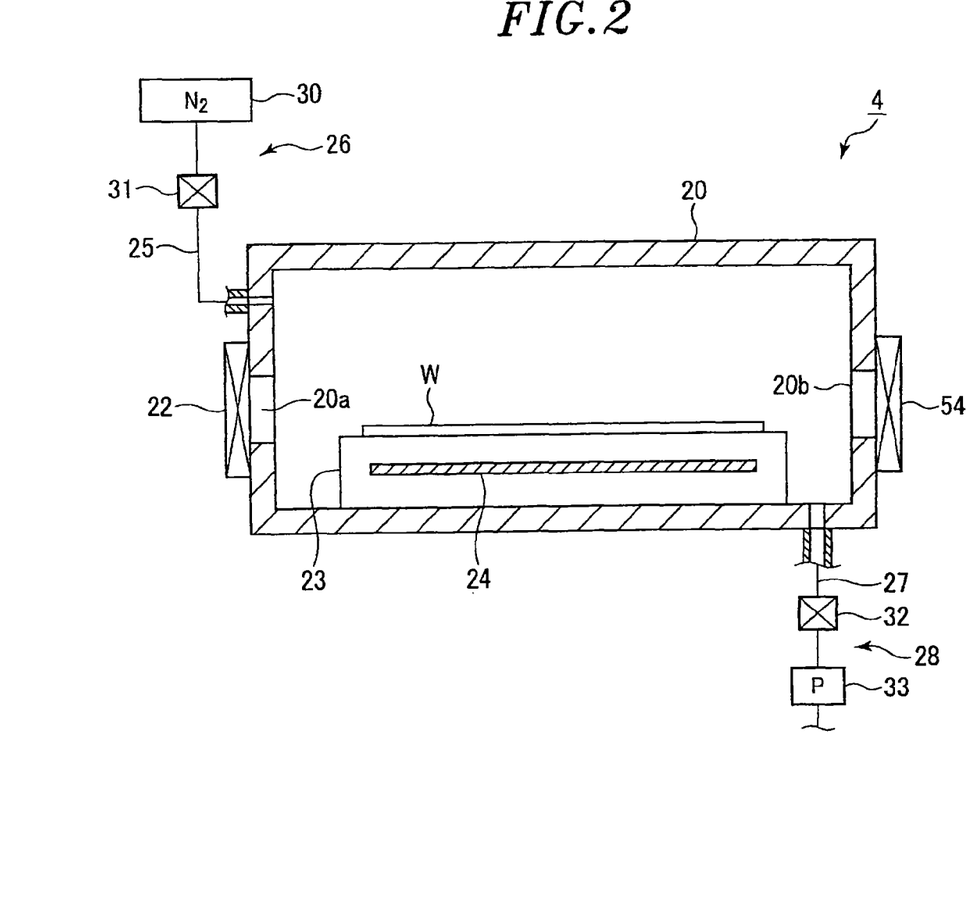
FIG. 2 is a cross-sectional view illustrating a post heat treatment (PHT) apparatus in the processing system shown in FIG. 1.

As shown in FIG. 2, the PHT apparatus 4 includes a vacuum evacuable chamber 20 and a mounting table 23 on which the wafer W is mounted in the chamber 20. A heater 24 is embedded in the mounting table 23. The wafer W, which has been subjected to the COR processing, is heated by the heater 24 to thereby vaporize the reaction products produced by the COR processing, which is called PHT. In a side of the chamber 20 facing the load-lock chamber 3, a loading/unloading port 20a through which the wafer W is transferred from/to the load-lock chamber 3 is arranged. The loading/unloading port 20a can be opened and closed by a gate valve 22. A loading/unloading port 20b through which the wafer W is transferred from/to the COR processing apparatus 5 is arranged in a side of the chamber 20 facing the COR processing apparatus 5. The loading/unloading port 20b can be opened and closed by a gate valve 54.

The PHT apparatus 4 further includes a gas supply mechanism 26 having a gas supply line 25 for supplying an inert gas, e.g., nitrogen gas ($N_2$) to the chamber 40 and a gas exhaust mechanism 28 having a gas exhaust line 27 for exhausting the inside of the chamber 20. The gas supply line 25 is connected to a nitrogen gas supply source 30. A flow rate control valve 31 is installed on the gas supply line 25 to open or close a flow path and adjust a flow rate of the supply gas. On the gas exhaust line 27 of the gas exhaust mechanism 28, an opening/closing valve 32 and a vacuum pump 33 are provided.

Figure 3:
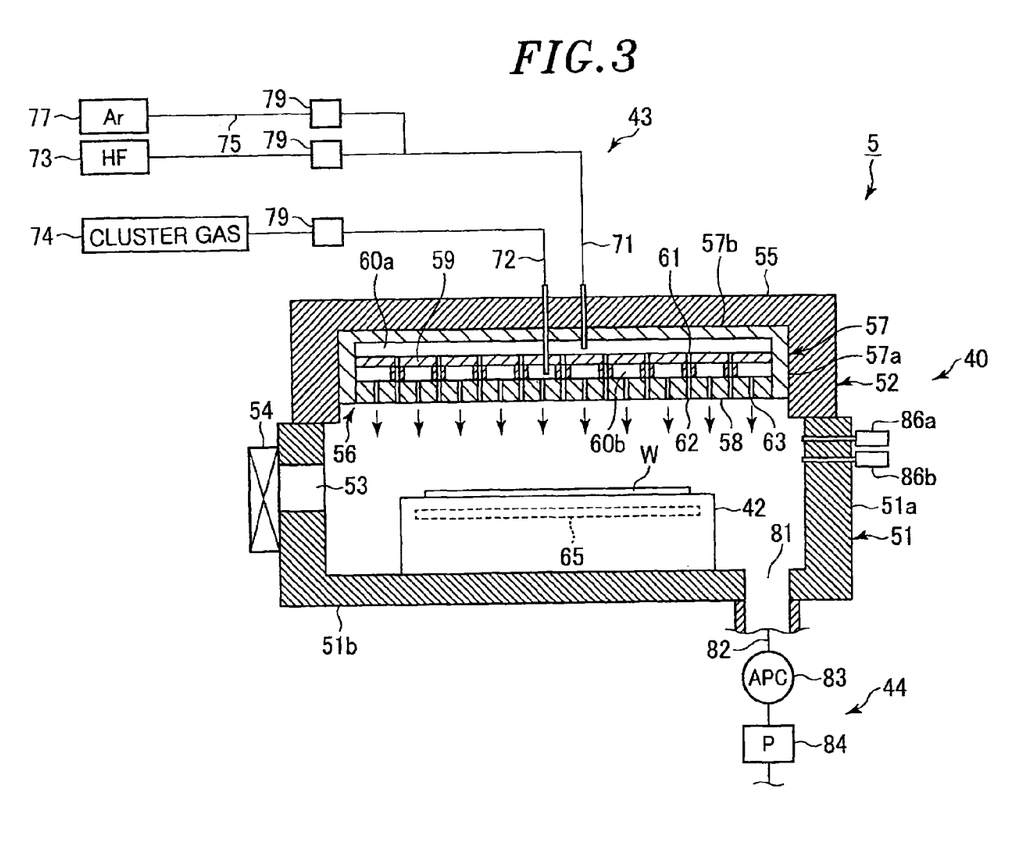
FIG. 3 is a cross-sectional view illustrating a chemical oxide removal (COR) processing apparatus as the etching apparatus in the processing system shown in FIG. 1.

The COR processing apparatus 5 includes, as shown in FIG. 3, an airtight chamber 40 and a mounting table 42 on which the wafer W is mounted in a substantially horizontal state in the chamber 40. The COR processing apparatus 5 further includes a gas supply mechanism 43 for supplying HF gas, $NH_3$ gas and the like to the chamber 40 and a gas exhaust mechanism 44 for exhausting the inside of the chamber 40.

The chamber 40 is formed of a chamber main body 51 and a cover 52. The chamber main body 51 has a substantially cylindrical sidewall 51a and a bottom 51b. The upper opening of the chamber main body 51 is closed by the cover 52. The sidewall 51a and the cover 52 are sealed with a sealant (not shown) to secure airtightness of the inside of the chamber 40.

On the sidewall 51a, there is provided a loading/unloading port 53 through which the wafer W is loaded/unloaded to/from the chamber 20 of the PHT apparatus 4. The loading/unloading port 53 can be opened and closed by the gate valve 54.

The mounting table 42 has a substantially round shape when seen from the top and is secured to the bottom 51b of the chamber 40. A temperature adjuster 65 is embedded in the mounting table 42 to control the temperature of the mounting table 42. The temperature adjuster 65 has a passageway through which a temperature control medium (e.g, water and the like) are circulated. The heat exchange is performed between the mounting table 42 and the temperature control medium flowing through the passageway, so that the temperature of the mounting table 42 is adjusted and consequently the temperature of the wafer W on the mounting table 42 is controlled.

The cover 52 of the chamber 40 includes an outer cover member 55 and a shower head 56 fitted in the outer cover member 55 to face the mounting table 42. The shower head 56 includes a main body 57 having a cylindrical sidewall 57a and an upper wall 57b and a shower plate 58 arranged in a bottom portion of the main body 57. Within a space defined by the main body 57 and the shower plate 58, a plate 59 is disposed parallel to the shower plate 58. A first space 60a is provided between the upper wall 57b of the main body 57 and the plate 59. A second space 60b is provided between the plate 59 and the shower plate 58.

A first gas supply line 71 of the gas supply mechanism 43 is inserted into the first space 60a and a plurality of gas passages 61 connected to the first space 60a are extended from the plate 59 to the shower plate 58. The gas passages 61 are connected to a plurality of first gas injection openings 62 formed in the shower plate 58. A second gas supply line 72 of the gas supply mechanism 43 is inserted into the second space 60b and the second space 60b communicates with a plurality of second gas injection openings 63 formed in the shower plate 58.

A gas supplied through the first gas supply line 71 to the first space 60a is injected into the chamber 40 through the gas passages 61 and the first gas injection openings 62. Further, a gas supplied through the second gas supply line 72 to the second space 60b is injected into the chamber 40 through the second gas injection openings 63.

The gas supply mechanism 43 includes the first gas supply line 71 and the second gas supply line 72 described above and further includes a HF gas supply source 73 and a cluster gas supply source 74 connected to the first gas supply line 71 and the second gas supply line 72, respectively. The first gas supply line 71 is connected to a third gas supply line 75, which is connected to an Ar gas supply source 77 for supplying Ar gas as a dilution gas. The dilution gas is not limited to Ar gas but may include another inert gas such as $N_2$ gas or the like. A flow rate controller 79 for opening/closing a flow path and controlling a flow rate is provided in each of the first, second and third gas supply line 71, 72 and 75. The flow rate controller 79 includes, e.g., an opening/closing valve and a mass flow controller.

Ar gas as the dilution gas and HF gas are injected from the first gas injection openings 62 into the chamber 40 through the first gas supply line 71, the first space 60a, and the gas passages 61. A cluster gas is sprayed from the second gas injection openings 63 into the chamber 40 through the second gas supply line 72 and the second space 60b.

Figure 4:
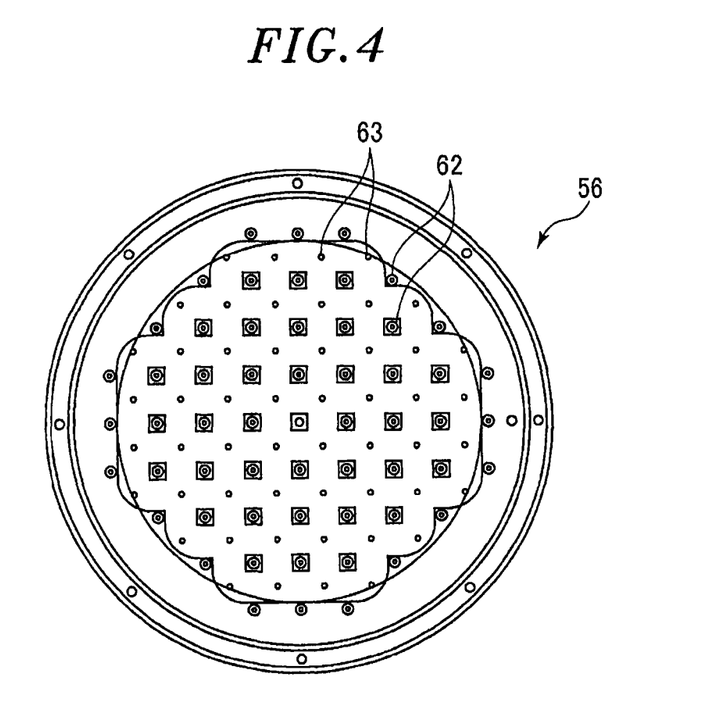
FIG. 4 is a bottom view of a shower head used in the COR processing apparatus as the etching apparatus in the processing system shown in FIG. 1.

As shown in a bottom view of FIG. 4, the first gas injection openings 62 through which HF gas and the like are injected and the second gas injection openings 63 through which the cluster gas is injected are alternately formed in a plural number.

The cluster gas sprayed through the second gas injection openings 63 is adiabatically expanded in the chamber 40 that is vacuum-exhausted by the gas exhaust mechanism 44. Thereafter, several to several tens of thousands of atoms and molecules of the gas clump together by the van der Waals force to form a gas cluster. The cluster gas for forming the gas cluster is not limited to a specific one but may be, e.g., an inert gas such as Ar gas, $N_2$ gas, $CO_2$ gas or the like.

HF gas as a reactive gas produces, as a reaction product, $NH_3$ gas and a solid fluorine compound when a SiN film is etched. The gas cluster has a function of effectively discharging the $NH_3$ gas as the reaction product to the outside of the chamber 40.

The gas exhaust mechanism 44 has a gas exhaust line 82 connected to a gas exhaust port 81 formed in the bottom 51b of the chamber 40. Further, the gas exhaust mechanism 44 has, on the gas exhaust line 82, an automatic pressure control (APC) valve 83 for controlling the pressure in the chamber 40 and a vacuum pump 84 for evacuating the inside of the chamber 40.

Two capacitance manometers 86a and 86b for measuring the pressure in the chamber 40 are provided to extend through the sidewall of the chamber 40 into the inside of the chamber 40. The capacitance manometer 86a is for high pressure and the capacitance manometer 86b is for low pressure. A temperature sensor (not shown) for detecting the temperature of the wafer W is provided near the wafer W mounted on the mounting table 42.

Components of the COR processing apparatus 5 such as the chamber 40, the mounting table 42 and the like are made of aluminum (Al) material. The Al material for the chamber 40 may be a pure one or may be formed by anodizing the inner surface (the inner surface of the camber main body 51, the underside of the shower head 56 and the like). The Al material for the mounting table 42 is required to have wear resistance, so that it is preferable to form an anodize film ($Al_2O_3$) having a high wear resistance on a surface of the mounting table 42 by anodizing the surface.

As shown in FIG. 1, the processing system 1 includes a control unit 90. The control unit 90 has a process controller 91 provided with a microprocessor (computer) for controlling each component. The process controller 91 is connected to a user interface 92, which has a keyboard through which an operator inputs a command or the like, a display on which an operation state of the processing system 1 is visually displayed, and the like so that the operator can manage the processing system 1. Further, the process controller 91 is connected to a storage unit 93, which stores control programs for realizing the supply of a processing gas, the exhaust of the inside of the chamber 40 in the COR processing apparatus 5, or the like by a control of the process controller 91, process recipes for performing a predetermined process in each component in the processing system 1 in accordance with process conditions, a variety of databases, and the like. The process recipes are stored in a suitable storage medium (not shown) in the storage unit 93. A desired recipe is called from the storage unit 93 and executed by the process controller 91, so that a desired process is carried out in the processing system 1 under the control of the process controller 91.

Next, an etching method used in the processing system 1 will be described in accordance with the embodiment of the present invention.

In the present embodiment, a SiN film on the wafer W is etched. For example, as shown in FIG. 5, with respect to the wafer W in which a SiN film 201 and a patterned $SiO_2$ film 202 are formed on the substrate 200, the SiN film 201 is etched.

Figure 5:
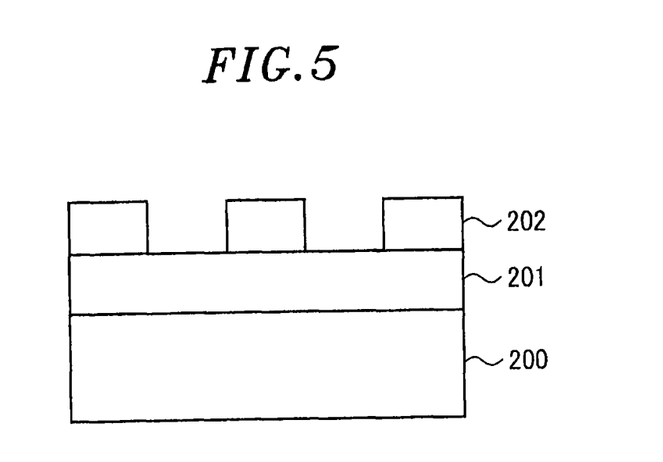
FIG. 5 is a cross-sectional view showing a structure of a substrate (wafer) to be processed applied to the embodiment of the present invention.

First, the wafer W shown in FIG. 5 is received in the carrier C to be transferred to the processing system 1. In the processing system 1, the wafer W is transferred from the carrier C at the loading/unloading unit 2 into the load-lock chamber 3 by one of the transfer arms 11a and 11b of the first transfer mechanism 11 and delivered to the pick of the second transfer mechanism 17.

Thereafter, the gate valve 16 at the atmosphere side is closed and the inside of the load-lock chamber 3 is vacuum evacuated. Then, the gate valves 22 and 54 are opened and the pick is extended into the COR processing apparatus 5 to mount the wafer W on the mounting table 42.

The pick is returned to the load-lock chamber 3 and the gate valve 54 is closed to make the inside of the chamber 40 airtight. In this state, the temperature of the wafer W on the mounting table 42 is adjusted to a predetermined temperature (e.g., 10 to 200° C.) by the temperature adjuster 65. HF gas and Ar gas are injected from the first gas injection openings 62 into the chamber 40 through the first gas supply line 71, the first space 60a and the gas passages 61.

Consequently, HF gas is supplied into the chamber 40, and the chamber 40 has an atmosphere including HF gas therein. The SiN film 201 formed on the wafer W selectively reacts with HF gas.

At this time, the $SiO_2$ film 202 would be hardly etched since $SiO_2$ is difficult to react with HF. However, when the SiN film 201 is etched with HF gas, $NH_3$ gas is produced as a reaction product, so that the $SiO_2$ film 202 is etched by the $NH_3$ gas as a catalyst. For this reason, in a state where the SiN film and the $SiO_2$ film coexist, it is very difficult to etch the SiN film with a higher etching selectivity than the $SiO_2$ film.

To solve such a problem, it is considered to vacuum-exhaust the inside of the chamber 40 and supply a purge gas into the chamber 40 at an appropriate timing to purge the $NH_3$ gas. However, in this process, purging the inside of the chamber 40 takes time and the mass productivity becomes poor.

In this embodiment, the cluster gas such as Ar gas or $CO_2$ gas is sprayed through the second gas injection openings 63 into the chamber 40 that is maintained in a vacuum state. The sprayed cluster gas is adiabatically expanded and several to several tens of thousands of atoms and molecules of the gas clump together by the van der Waals force to form the gas cluster. The $NH_3$ gas produced as the reaction product in the chamber 40 is discharged to the outside of the chamber 40 by the gas cluster. The gas cluster can rapidly discharge the $NH_3$ gas produced as the reaction product in the chamber 40 since the gas cluster acts physically. Accordingly, a time period required for purging the $NH_3$ gas can be greatly reduced compared to a normal gas purge. Therefore, the $NH_3$ gas produced by the etching reaction can be removed from the chamber 40 without deteriorating the mass productivity.

As a result, the SiN film can be etched by HF gas with high etching selectivity while the $SiO_2$ film is hardly etched.

Figure 6:
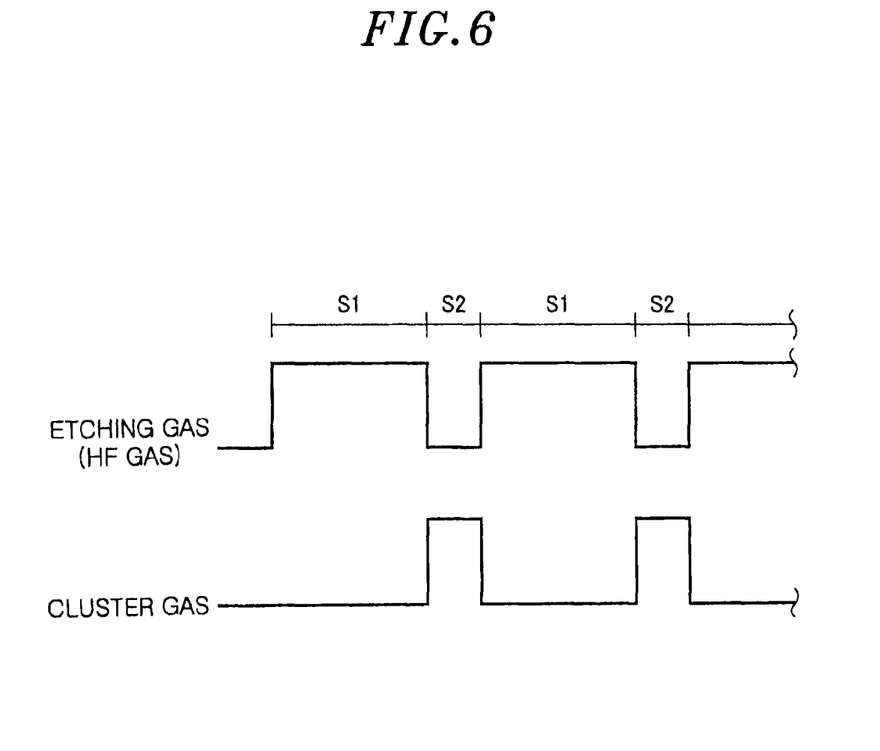
FIG. 6 shows a sequence in which an etching process using HF gas and a purge process using a gas cluster are alternately performed.

In an actual etching, as shown in FIG. 6, an etching process S1 in which HF gas is supplied and a purge process S2 in which a gas cluster generated by supplying the cluster gas is used may be alternately repeated. The purge process S2 using the gas cluster takes merely several seconds. The etching process S1 requires about 10 to 30 seconds. Alternatively, HF gas as the etching gas and the gas cluster may be simultaneously supplied to perform an etching while discharging $NH_3$ gas as the reaction product.

After the etching is completed, a solid fluorine compound remains as the reaction product on the surface of the wafer W. The fluorine compound is heated and removed by the PHT apparatus 4.

Specifically, the gate valves 22 and 54 are opened and the pick of the second transfer mechanism 17 picks a processed wafer W on the mounting table 42 to mount the processed wafer W on the mounting table 23 in the chamber 20 of the PHT apparatus 4. The pick is retracted to the load-lock chamber 3 and the gate valves 22 and 54 are closed. Thereafter, while introducing $N_2$ gas into the chamber 20, the wafer W on the mounting table 23 is heated by the heater 24. Accordingly, the fluorine compound produced by the COR processing is heated to be vaporized and removed.

In this way, by performing PHT after COR processing, the fluorine compound as the reaction product can be removed in a dry atmosphere, and a watermark or the like does not occur. Further, the etching can be performed without plasma and thus can be performed with a small damage. Furthermore, In the COR processing, the etching is not performed after a predetermined time, so that a reaction does not occur even if over-etching is tried and the management of an end point is unnecessary.

As described above, in accordance with the present invention, in the COR processing apparatus 5, $NH_3$ gas produced by the reaction when the SiN film is etched with HF gas is discharged by a gas cluster to the outside of the chamber 40. Therefore, the $NH_3$ gas can be removed in a greatly short time. Further, by removing the $NH_3$ gas from the chamber 40, etching of the $SiO_2$ film caused by coexistence of HF gas and $NH_3$ gas can be suppressed. Consequently, the SiN film can be etched with a higher etching selectivity than the $SiO_2$ film.

The present invention is not limited to the above-described embodiment and can be modified in various forms. For example, in the above embodiment, the case where the SiN film is etched with HF gas has been described, but an etching target film and an etching gas are not limited thereto. When a certain layer of a laminated film is etched with a certain etching gas, if a different gas, contributing to an etching of a different layer of the laminated film, is produced, the etching gas and the etching target film are applicable to the present invention. In other words, in all cases where a gas needed to be removed is produced by a reaction in etching, e.g., a case where $SiF_4$ is produced during an etching of a film containing Si by HF gas, the etching target film and the etching gas are effective in the present invention.

Further, an inert gas such as Ar gas, $N_2$ gas and $CO_2$ gas has been used as the cluster gas in the above embodiment. However, the cluster gas may not be limited to the inert gas as long as it can discharge a gas produced by a reaction in etching without an adverse effect on the etching.

Further, in the above embodiment, a semiconductor wafer has been used as a substrate to be processed. However, the substrate to be processed is not limited to the semiconductor wafer and may include a ceramic substrate, a flat panel display (FPD) substrate represented by a liquid crystal display (LCD) substrate, and the like.

While the invention has been shown and described with respect to the embodiments, it will be understood by those skilled in the art that various changes and modifications may be made without departing from the scope of the invention as defined in the following claims.

What is claimed is:

1. An etching method, comprising:
   accommodating a substrate to be processed having an etching target film into a chamber;
   supplying an etching gas into the chamber to etch the etching target film; and
   discharging, from the chamber, a gas produced by a reaction when the etching target film is etched, with a gas cluster generated by spraying a cluster gas into the chamber,
   wherein the sprayed cluster gas undergoes adiabatic expansion and then gas clumping by van der Waals force to form the gas cluster.

2. The etching method of claim 1, wherein the etching target film is a SiN film, the etching gas is HF gas, and the gas produced by the reaction is $NH_3$ gas.

3. The etching method of claim 1, wherein an inert gas is used as the cluster gas.

4. The etching method of claim 3, wherein the cluster gas is Ar gas or $CO_2$ gas.

5. The etching method of claim 1, wherein said etching the etching target film and said discharging the gas produced by the reaction are alternately performed.

6. The etching method of claim 1, wherein said etching the etching target film and said discharging the gas produced by the reaction are simultaneously performed.

7. The etching method of claim 1, wherein the reaction occurs between the etching target film and the etching gas.

8. The etching method of claim 1, wherein the gas cluster is several to several tens of thousands of atoms and molecules of the gas clumping together by the van der Waals force.

9. The etching method of claim 1, wherein the substrate has a laminated film on its surface, a layer of the laminated film is the etching target film and the gas produced by the reaction contributes to an etching of a different layer of the laminated film.

10. The etching method of claim 9, wherein the etching target film is a SiN film, the different layer of the laminated film is a $SiO_2$ film, the etching gas is HF gas, and the gas produced by the reaction is $NH_3$ gas.

11. The etching method of claim 9, wherein the etching target film and the different layer of the laminated film have different kind of chemical compositions from each other.

* * * * *